(12) United States Patent
Iwashita

(10) Patent No.: US 7,709,179 B2
(45) Date of Patent: May 4, 2010

(54) NEGATIVE RESIST COMPOSITION AND METHOD FOR FORMING RESIST PATTERN

(75) Inventor: Jun Iwashita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 191 days.

(21) Appl. No.: 11/909,071

(22) PCT Filed: Apr. 7, 2006

(86) PCT No.: PCT/JP2006/307421

§ 371 (c)(1),
(2), (4) Date: Sep. 18, 2007

(87) PCT Pub. No.: WO2006/115010

PCT Pub. Date: Nov. 2, 2006

(65) Prior Publication Data

US 2009/0035697 A1    Feb. 5, 2009

(30) Foreign Application Priority Data

Apr. 20, 2005    (JP)    ............... 2005-122711

(51) Int. Cl.
G03F 7/004    (2006.01)
G03F 7/30    (2006.01)

(52) U.S. Cl. .................... 430/270.1; 430/325; 430/921; 430/922

(58) Field of Classification Search ............. 430/270.1, 430/325, 921, 922
See application file for complete search history.

(56) References Cited

U.S. PATENT DOCUMENTS

| | | | |
|---|---|---|---|
| 5,034,304 | A | 7/1991 | Feely |
| 6,444,397 | B2 | 9/2002 | Hada et al. |
| 7,189,492 | B2 * | 3/2007 | Kodama et al. ........... 430/270.1 |
| 7,217,496 | B2 * | 5/2007 | Khojasteh et al. ........ 430/270.1 |
| 2002/0058197 | A1 | 5/2002 | Nozaki et al. |
| 2003/0171490 | A1 | 9/2003 | Breyta et al. |
| 2005/0095532 | A1* | 5/2005 | Kodama et al. ........... 430/270.1 |
| 2006/0040203 | A1* | 2/2006 | Kodama et al. ........... 430/270.1 |
| 2006/0128914 | A1* | 6/2006 | Allen et al. ................. 526/245 |

FOREIGN PATENT DOCUMENTS

| | | |
|---|---|---|
| EP | 1586570 | 10/2005 |
| JP | 2003005372 | 1/2003 |
| JP | 2004177486 | 6/2004 |
| JP | 2004272227 | 9/2004 |

OTHER PUBLICATIONS

Conley, et al., "Negative Photoresist for 157 nm Microlithography; A Progress Report," *SPIE Advances in Resist Technology and Processing XIX*, 2002, vol. 4690, pp. 94-100.
Iwasa, et al., "Novel negative photoresist based on polar alicyclic polymers for ArF excimer laser lithography", *SPIE Advances in Resist Technology and Processing XIV*, 1998, vol. 3333, pp. 417-424.
Maeda, et al., "ArF Chemically Amplified Negative Resist Using Alicyclic Epoxy Polymer", *Journal of Photopolymer Science and Technology*, 1998, vol. 11, No. 3, pp. 507-512.
Tsuchiya, et al., "Investigation of Acid-Catalyzed Insolubilization Reactions for Alicyclic Polymers with Carboxyl Groups", *Journal of Photopolymer Science and Technology*, 1997, vol. 10, No. 4, pp. 579-584.
International Search Report from PCT/JP2006/307421, mailed on May 2, 2006.

* cited by examiner

*Primary Examiner*—John S Chu
(74) *Attorney, Agent, or Firm*—Knobbe, Martens, Olson & Bear, LLP

(57) ABSTRACT

A chemically amplified negative resist composition is provided in addition to a method of forming a resist pattern from which a desirable pattern shape can be obtained. A negative resist composition in which a resin component (A) contains a resin component (A1) having a structural unit (a1) containing an alicyclic group having a fluorinated hydroxyalkyl group and a structural unit (a2) derived from an acrylic acid ester and containing a hydroxyl group-containing alicyclic group; and an acid generator component (B) contains an acid generator (B1) expressed by the following general formula (B1):

[Chemical Formula 1]

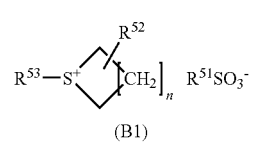

(B1)

(where $R^{51}$ represents a straight chain, branched chain or cyclic alkyl group or a fluorinated alkyl group; $R^{52}$ represents a hydrogen atom, hydroxyl group, halogen atom, straight chain, branched chain or cyclic alkyl group, straight chain or branched chain halogenated alkyl group, or straight chain or branched chain alkoxy group; $R^{53}$ represents an aryl group which may have a substituent; and n represents an integer of 1 to 3).

11 Claims, No Drawings

NEGATIVE RESIST COMPOSITION AND METHOD FOR FORMING RESIST PATTERN

RELATED APPLICATIONS

This application is the U.S. National Phase filing under 35 U.S.C. §371 of PCT/JP2006/307421, filed Apr. 7, 2006, which designated the United States and was published in a language other than English, which claims priority under 35 U.S.C. §119(a)-(d) to Japanese Patent Application No. 2005-122711, filed Apr. 20, 2005. The content of these applications is incorporated herein by reference in their entireties.

TECHNICAL FIELD

The present invention relates to a negative resist composition and a method of forming a resist pattern.

BACKGROUND ART

In the past, a chemically amplified negative resist composition composed of the combination of an acid generator and an alkali-soluble resin, such as a novolak resin or a polyhydroxy styrene, and an amino resin, such as a melamine resin or a urea-resin, has been used as a negative resist composition used for a process using an i-ray and a KrF excimer laser light (wavelength of 248 nm) as a light source (see Patent Document 1).

Also, as a negative resist composition used for a process using an ArF excimer laser of a short wavelength, there has been proposed a negative resist composition for improving transparency with respect to the ArF excimer laser, that is a composition, for example, which includes resin components having a carboxyl group, a crosslinking agent having an alcoholic hydroxyl group, and an acid generator.

This type of composition changes alkali solubility of the resin components to alkali insolubility by reacting the carboxyl group of the resin components with the alcoholic hydroxyl group of the crosslinking agent by action of acids generated from the acid generator.

Moreover, there has also been proposed a negative resist composition which includes a resin component having both a carboxyl group or a carboxylic acid ester group, and an alcoholic hydroxyl group and an acid generator and changes alkali solubility of the resin components to alkali insolubility by reacting the carboxyl group or the carboxylic acid ester group in the resin component with the alcoholic hydroxyl group by an action of acids generated from the acid generator (see, Non-Patent Documents 1 to 4 and Patent Document 2).

[Patent Document 1] Japanese Examined Patent Application Publication No. 8-3635

[Patent Document 2] Japanese Unexamined Patent Application Publication No. 2000-206694

[Non-Patent Document 1] Journal of Photopolymer Science and Technology, Vol. 10, No. 4, pages 579 to 584 (1997)

[Non-Patent Document 2] Journal of Photopolymer Science and Technology, Vol. 11, No. 3, pages 507 to 512 (1998)

[Non-Patent Document 3] SPIE Advances in Resist Technology and Processing XIV, Vol. 3333, pages 417 to 424 (1998)

[Non-Patent Document 4] SPIE Advances in Resist Technology and Processing XIX, Vol. 4690, pages 94 to 100 (2002)

DISCLOSURE OF THE INVENTION

Problems to be Solved by the Invention

However, when a conventional negative resist composition is used to form a resist pattern on a substrate, a desirable pattern cannot be obtained.

The present invention is contrived to solve the aforementioned problem and an object of the invention is to provide a negative resist composition and a method of forming a resist pattern from which a desirable pattern can be obtained.

Means for Solving the Problems

In order to achieve the object, the invention employs the following configuration.

According to a first aspect, there is provided a negative resist composition including (A) an alkali soluble resin component, (B) an acid generator component which generates acids upon exposure, and (C) a crosslinking agent component: in which the component (A) contains an alkali soluble resin component (A1) which has a structural unit (a1) containing an alicyclic group having a fluorinated hydroxyalkyl group and a structural unit (a2) derived from an acrylic acid ester and containing a hydroxyl group-containing alicyclic group; and the component (B) contains an acid generator (B1) expressed by the following General Formula (B1):

[Chemical Formula 1]

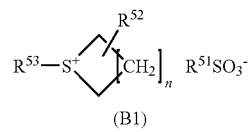

(B1)

(where $R^{51}$ represents a straight chain, branched chain or cyclic alkyl group, or a straight chain, branched chain or cyclic fluorinated alkyl group; $R^{52}$ represents a hydrogen atom, a hydroxyl group, a halogen atom, a straight chain or branched chain alkyl group, a straight chain or branched chain halogenated alkyl group, or a straight chain or branched chain alkoxy group; $R^{53}$ represents an aryl group which may have a substituent; and n represents an integer of 1 to 3).

According to a second aspect, there is provided a method of forming a resist pattern including: forming a resist film on a substrate by using a negative resist composition of the invention; selectively exposing the resist film; and forming a resist pattern by subjecting the resist film to an alkali developing treatment.

In addition, "exposure" is defined to include the whole exposure process of radiations, such as an exposure of an electron ray in addition to the exposure of light, within the scope of the present Specification and Claims.

Further, unless stated otherwise, in the present Specification and Claims, an "alkyl group" refers to a straight chain, branched chain, or cyclic alkyl group.

Further, unless stated otherwise, a "straight chain or cyclic alkyl group" refers to a straight chain or cyclic alkyl group.

EFFECT OF THE INVENTION

By the use of the negative resist composition and the method of forming the resist pattern of the invention, a desirable pattern can be obtained.

BEST MODES FOR CARRYING OUT THE INVENTION

Negative Resist Composition

<Alkali Soluble Resin Component (A)>

In the invention, a component (A) contains an alkali soluble resin component (A1) which has a structural unit (a1) containing an alicyclic group having a fluorinated hydroxyalkyl group [hereinafter, simply referred to as a structural unit (a1)] and a structural unit (a2) derived from an acrylic acid ester and containing a hydroxyl group-containing alicyclic group [hereinafter, simply referred to as a structural unit (a2)].

In addition, the "structural unit" refers to a monomer unit constituting a polymer (resin).

The "structural unit derived from an acrylic acid" refers to a structural unit in which ethylenic double bonds of the acrylic acid are opened.

The "structural unit derived from an acrylic acid ester" refers to a structural unit in which ethylenic double bonds of acrylic acid ester are opened.

The "structural unit derived from an acrylic acid ester" refers to a structural unit in which a hydrogen atom at α-position is substituted with other substituent such as alkyl group or the like. In addition, in the "structural unit derived from an acrylic acid" and the "structural unit derived from an acrylic acid ester", the "α-position (carbon atom at α-position)" refers to a carbon atom bonded with a carboxyl group unless stated otherwise.

The "structural unit derived from an acrylic acid ester" refers to a structural unit in which a hydrogen atom bonding to a carbon atom at α-position is substituted with other substituents such as an alkyl group or a structural unit derived from an acrylic acid ester in which a carbon atom at α-position is bonded with a hydrogen atom.

Structural Unit (a1)

Since the component (A1) has the structural unit (a1), the advantage of the invention improves. Also, an effect for preventing swelling can be obtained.

In the structural unit (a1), the alicyclic group has the fluorinated hydroxyalkyl group.

The fluorinated hydroxyalkyl group is configured such that a part of or all of hydrogen atoms of the alkyl group having the hydroxyl group is substituted with a fluorine atom. In this group, the hydrogen atom of the hydroxyl group is readily separated by fluorination.

In the fluorinated hydroxyalkyl group, the alkyl group has a straight chain or branched chain and carbon atoms thereof are not particularly limited but, for example, they are in the range of 1 to 20, preferably 4 to 16. The number of the hydroxyl group is not particularly limited but it is usually 1.

Of these, in the alkyl group, it is preferable that a fluorinated alkyl group and/or fluorine atom be bonded to the carbon atom at the α-position bonded with the hydroxyl group (herein, indicating the carbon atom at α-position of the hydroxyalkyl group). In addition, in the fluorinated alkyl group bonding at the α-position, all of the hydrogen atoms of the alkyl group are preferably substituted with the fluorine atom.

The alicyclic group may have a single ring or multiple rings but preferably include multiple rings. In addition, it is preferably an alicyclic hydrocarbon group. In addition, it is preferably a saturated group. In addition, the alicyclic group preferably has 5 to 15 carbon atoms.

Specific examples of the alicyclic group are as follows.

Examples of monocyclic groups include groups in which one or more, preferably two or more, and more preferably two hydrogen atoms have been removed from a cycloalkane. Examples of polycyclic groups include groups in which one or two hydrogen atom(s) have been removed from a bicycloalkane, tricycloalkane, tetracycloalkane or the like.

Specific examples of the monocyclic groups include groups in which one or more, preferably two or more, and more preferably two hydrogen atoms have been removed from cyclopentane or cyclohexane and preferred is a group in which two hydrogen atoms have been removed from cyclohexane.

Specific examples of the polycyclic groups include groups in which one or more, preferably two or more, and more preferably two hydrogen atoms have been removed from a polycycloalkane such as adamantane, norbornane, isobornane, tricyclodecane or tetracyclododecane.

The polycyclic group can be appropriately selected and used from groups constituting acid dissociable dissolution inhibiting groups of a resin for a positive photoresist composition used for an ArF excimer laser process.

Of these, a group in which two hydrogen atoms has been removed from cyclohexane, adamantane, norbornane, or tetracyclododecane is preferred in view of industrial availability.

Among these monocyclic groups and polycyclic groups, a group in which two hydrogen atoms have been removed from norbornane is particularly preferable.

The structural unit (a1) is preferably a structural unit derived from acrylic acid and has a structure in which the alicyclic group is bonded to the ester group [—C(O)O—] of acrylate ester (structure in which the hydrogen atom of the carboxyl group is substituted with the alicyclic group).

More specifically, as the structural unit (a1), a structural unit expressed by the following General Formula (1) is preferred.

[Chemical Formula 2]

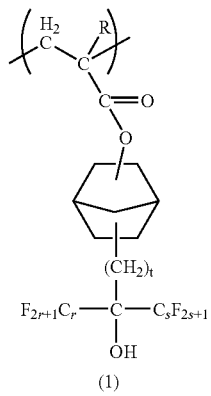

(1)

(where R represents a hydrogen atom, an alkyl group, a fluorinated alkyl group, or a fluorine atom, and r, s, and t represent independently an integer of 1 to 5.)

R represents a hydrogen atom, an alkyl group, a fluorinated alkyl group, or a fluorine atom.

As the alkyl group, a straight chain or cyclic alkyl group having 5 or less carbon atoms is preferred and, for example, a methyl group, an ethyl group, a propyl group, an isopropyl group, a n-butyl group, an isobutyl group, a tert-butyl group, a pentyl group, an isopentyl group, and a neopentyl group are mentioned. Of these, the methyl group is preferred.

The fluorinated alkyl group is preferably a group in which one or more of hydrogen atom(s) in the straight chain or cyclic alkyl group having 5 or less carbon atoms is substituted with the fluorine atom. Specific examples of the alkyl group are as described above.

The hydrogen atom substituted with the fluorine atom may be a part of or all of the hydrogen atoms constituting the alkyl group.

As R, a hydrogen atom or alkyl group is preferable, a hydrogen atom or methyl group is more preferable, and the hydrogen atom is most preferable.

In addition, it is preferable that each one of r, s, and t is 1.

Among these expressed by the General Formula (1), a structural unit derived from α,α'-bis-(trifluoromethyl)-bicyclo[2.2.1]hepta-5-yl-2-ethanol acrylate represented below is preferred because it is advantageous and can be readily synthesized, and offers a high level of etching resistance.

Compound (1-a)

[Chemical Formula 3]

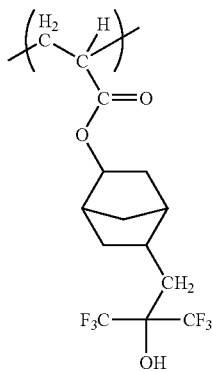

The structural unit (a1) may be used alone, or in combinations of two or more.

Structural Unit (a2)

Since the component (A1) has the structural unit (a2), the advantages of the invention improve. Also, an effect for preventing the swelling can be obtained. In addition, an effect for improving etching resistance can be obtained.

When the component (A1) is added in the negative resist composition, the hydroxyl group (alcoholic hydroxyl group) of the structural unit (a2) reacts with the crosslinking agent (C) by the action of the acids generated from the acid generator (B) and thus alkali solubility of the component (A1) to the alkali developer changes to insolubility.

In the structural unit (a2), it is preferable that the hydroxyl group-containing alicyclic group is bonded to the ester group (—C(O)O—) of acrylic acid ester.

Furthermore, in the structural unit (a2), other substituent different from a hydrogen atom may be bonded to the α-position (carbon atom at α-position). As the substituent, an alkyl group, a fluorinated alkyl group, or a fluorine atom may be used.

The description of these groups are the same as that of R in the general formula (1) of the structural unit (a1). Among the groups bondable to the α-position, a hydrogen atom or an alkyl group is preferable, a hydrogen atom or a methyl group is more preferable, and a hydrogen atom is most preferable.

In addition, the hydroxyl group-containing alicyclic group refers to a group in which the hydroxyl group is bonded to the alicyclic group.

For example, the hydroxyl group(s) bonded to the alicyclic group is preferably 1 to 3, and more preferably 1.

In addition, the straight chain or branched chain alkyl group having 1 to 4 carbon atoms may be bonded to the alicyclic group.

Here, the alicyclic group may have a single ring or multiple rings but preferably it has multiple rings. Furthermore, the alicyclic hydrocarbon group and the saturated group are preferred. The alicyclic group preferably has 5 to 15 carbon atoms.

Specific examples of the alicyclic group (a state before the hydroxyl group is bonded) are as follows.

Examples of the monocyclic group include groups in which one or more hydrogen atoms have been removed from cycloalkane. Examples of the polycyclic group include groups in which one or more hydrogen atoms have been removed from a bicycloalkane, tricycloalkane, tetracycloalkane or the like.

Specific examples of the monocyclic group include groups in which one or more hydrogen atoms have been removed from a cyclopentane and a cyclohexane, and a cyclohexyl group is preferred.

Examples of the polycyclic group include groups in which one or more hydrogen atoms have been removed from a polycycloalkane such as adamantane, norbornane, isobornane, tricyclodecane or tetracyclododecane.

The polycyclic group can be appropriately selected and used from groups constituting acid dissociable, dissolution inhibiting groups of a resin for a positive photoresist composition used for an ArF excimer laser process.

Of these groups, a cyclohexyl group, an adamantyl group, a norbornanyl group, or a tetracyclododecanyl group is preferred in terms of industrial ready availability.

Among these monocyclic groups and polycyclic groups, the cyclohexyl group and the adamantyl group are preferred and the adamantyl group is particularly preferred.

Specific examples of the structural unit (a2) include a structural unit expressed by the following General Formula (2);

[Chemical Formula 4]

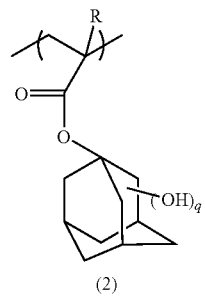

(2)

(R represents a hydrogen atom, alkyl group, fluorinated alkyl group, or fluorine atom and q is an integer of 1 to 3).

R represents the hydrogen atom, the alkyl group, fluorinated alkyl group, or the fluorine atom bonded to the α-position and the description thereof is the same as that of the general formula (1). In the general formula (2), it is most preferable that R is a hydrogen atom.

Further, q represents an integer of 1 to 3 but it is preferably 1.

The bonding position of the hydroxyl group is not particularly limited, but it is preferably the 3-position of the adamantyl group.

The structural unit (2) may be used alone, or in combinations of two or more.

It is preferable that the component (A1) includes, in addition to the structural unit (a1) and the structural unit (a2), a structural unit (a3) which is derived from acrylic acid, which does not include a ring structure and which has an alcoholic hydroxyl group at a side chain [hereinafter, referred to as a structural unit (a3)].

Since the component (A1) contains the structural unit (a3), an improvement in resolution can be achieved and a decrease in film thickness can be prevented. In addition, crosslinking reaction at the time of forming a pattern can be favorably controlled. Furthermore, the film density tends to be improved. Accordingly, the heat resistance tends to be improved and the etching resistance improves.

The phrase of "not having a ring structure" refers to "not having an alicyclic group or aromatic group".

Since the structural unit (a3) does not include a ring structure, it is apparently different from the structural unit (a2). When the component (A1) having the structural unit (a3) is added in the negative resist composition, the hydroxyl group of the hydroxyalkyl group of this structural unit (a3) and the hydroxyl group of the structure unit (a2) react with the crosslinking agent (C) by the action of acids generated from the acid generator (B) and thus the component (A1) changes from soluble to insoluble in alkali developer.

The term of "having an alcoholic hydroxyl group in a side chain" refers to a structural unit bonded with, for example, a hydroxyalkyl group.

The hydroxyalkyl group may be directly bonded to a carbon atom on the α-position of the main chain (a moiety where ethylenic double bonds of the acrylic acid are opened) or may be substituted with the hydrogen atom of the carboxyl group of the acrylic acid to constitute an ester, and the structural unit preferably includes one of or both of these configurations in the structural unit (a3).

In addition, when the hydroxyalkyl group is not bonded to the α-position, the alkyl group, the fluorinated alkyl group, or the fluorine atom may be bonded to the carbon atom at the α-position, instead of the hydrogen atom. The description thereof is the same as that of the general formula (1).

In addition, as the structural unit (a3), preferred is a structural unit expressed by a general formula (3) described below.

[Chemical Formula 5]

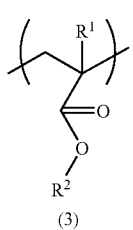

(3)

(where $R^1$ represents a hydrogen atom, an alkyl group, a fluorinated alkyl group, a fluorine atom, or a hydroxyalkyl group, $R^2$ represents a hydrogen atom, an alkyl group, or a hydroxyalkyl group, and at least one of $R^1$ and $R^2$ is a hydroxyalkyl group.)

In the hydroxyalkyl group is preferably a lower hydroxyalkyl group having 10 or less carbon atoms and has a straight chain or branched chain, it is more preferably the lower hydroxyalkyl group having 2 to 8 carbon atoms, and it is most preferably a hydroxymethyl group or a hydroxyethyl group. The numbers of the hydroxyl groups and bonding positions thereof are not particularly limited but they are usually one. In addition, it is preferably bonded to a terminal moiety of the alkyl group.

In $R^1$, the alkyl group is preferably a straight chain or cyclic alkyl group having 10 or less carbon atoms, more preferably a straight chain or cyclic alkyl group having 2 to 8 carbon atoms, and most preferably an ethyl group or a methyl group.

In $R^1$, the fluorinated alkyl group is preferably a group in which a part or all of the hydrogen atoms in a straight chain or cyclic alkyl group having 5 or less carbon atoms (preferably an ethyl group or a methyl group) is substituted with a fluorine.

In $R^2$, the alkyl group and the hydroxyalkyl group are the same as that of $R^1$.

Specific examples of the structural unit (a3) include a structural unit derived from α-(hydroxyalkyl)acrylic acid (here, a structural unit derived from acrylic acid ester is not included), a structural unit derived from α-(hydroxyalkyl)acrylic acid alkyl ester, and a structural unit derived from (α-alkyl)acrylic acid hydroxyalkyl ester.

Among these, the structural unit (a3) including the structural unit derived from α-(hydroxyalkyl)acrylic acid alkyl ester is preferred from the viewpoint of improvements in the advantages and increase in the film density.

In addition, among these, a structural unit derived from α-(hydroxymethyl)-acrylic acid ethyl ester or α-(hydroxymethyl)-acrylic acid methyl ester is preferred.

Moreover, it is preferable when the structural unit (a3) includes the structural unit derived from acrylic acid (α-alkyl) hydroxyalkyl ester. Among these, a structural unit derived from α-methyl-acrylic acid hydroxyethyl ester or α-methyl-acrylic acid hydroxy methyl ester is preferred.

The structural unit (a3) may be used alone or in combinations of two or more.

In the invention, it is preferable that the component (A1) further includes a structural unit (a4) derived from acrylic acid ester having lactone-containing monocyclic or polycyclic group [hereinafter, referred to as the structural unit (a4)], in addition to the structural unit (a1) and the structural unit (a2).

In addition, the structural unit (a3) may be further added in combination with the structural unit (a1), the structural unit (a2), and the structural unit (a4).

The lactone-containing monocyclic or polycyclic group of the structural unit (a4) is effective, when it is used to form the resist film and in increasing the adhesion of the resist film to the substrate or in increasing a hydrophilic property with a developer. Moreover, an effect for controlling the swelling improves.

In addition, here, the term "lactone ring" refers to a single ring containing a —O—C(O)-structure and this ring is counted as the first ring. Accordingly, the case in which the only ring structure is the lactone ring is referred to as a monocyclic group, and groups containing other ring structures are described as polycyclic groups regardless of the structure of the other rings.

As the structural unit (a4), any one can be used without limitation as long as it includes a lactone ring having such ester structure (—O—C(O)—) and a ring structure.

Specifically, examples of the lactone-containing monocyclic group include groups in which one hydrogen atom has been removed from γ-butyrolactone. Examples of the lactone-containing polycyclic groups include groups in which one hydrogen atom has been removed from a lactone-containing bicycloalkane, tricycloalkane, tetracycloalkane or the like.

Particularly, a group in which one hydrogen atom has been removed from a lactone-containing tricycloalkane having the following structural formula group is preferred from the viewpoint of industrial availability.

Structural Formula (i)

[Chemical Formula 6]

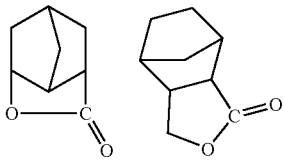

In addition, the structural unit (a4) is preferably lactone-containing polycyclic groups. Among these, a polycyclic group having norbornane lactone is preferred.

In the structural unit (a4), the α-position (carbon atom on the α-position) may be bonded with other substituents instead of a hydrogen atom. Examples of the substituent include preferably an alkyl group, a fluorinated alkyl group, or a fluorine atom.

Such description is the same as that of R in the general formula (1) of the structural unit (a1). Among the groups capable of bonding to the α-position, a hydrogen atom or an alkyl group is preferable, a hydrogen atom or a methyl group is more preferable, and a hydrogen atom is most preferable.

Specific examples of the structural unit (a4) include structural units expressed by general formulas (a-4-1) to (a-4-5) described below.

[Chemical Formula 7]

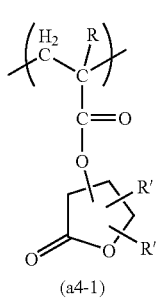
(a4-1)

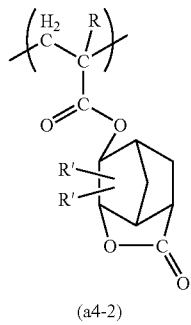
(a4-2)

-continued

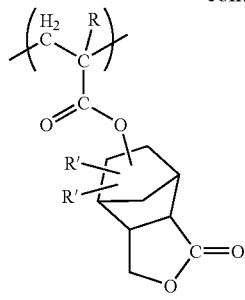
(a4-3)

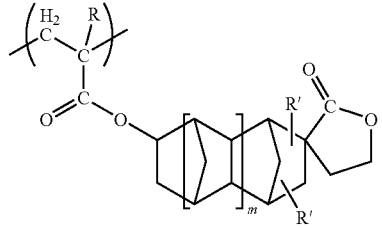
(a4-4)

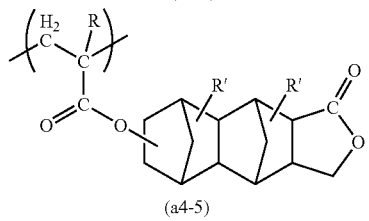
(a4-5)

(where R is as described above, R' represents independently a hydrogen atom, an alkyl group, or an alkoxy group having 1 to 5 carbon atoms, and m is an integer of 0 or 1.)

The alkyl group of R' in the general formulas (a-4-1) to (a-4-5) is the same as that of R in the structural unit (a1). In the general formulas (a-4-1) to (a-4-5), R' is preferably a hydrogen atom from the viewpoint of industrial availability.

As the structural unit (a4), units expressed by the general formulas (a4-2) to (a4-3) are most preferable.

The structural unit (a4) may be used alone or in combinations of two or more.

Combinations of Structural Units (a1) to (a4)

In the invention, the structural unit (a1) to the structural unit (a4) is preferably used by selecting a group from four pairs as follows.

(I) Combinations of Structural Unit (a1) and Structural Unit (a2)

Here, the structural unit (a1) is a structural unit expressed by the general formula (1) and it is preferable that R in the General Formula (1) is a hydrogen atom. At the same time, it is preferred that a hydrogen atom is bonded to the α-position of the structural unit (a2) (carbon atom bonded with a carboxyl group). This is because a dissolution contrast becomes good.

(II) Combinations of Structural Unit (a1), Structural Unit (a2), and Structural Unit (a3)

Here, the structural unit (a1) is a structural unit expressed by the General Formula (1) and it is preferable that R in the general formula (1) is a hydrogen atom. At the same time, it is preferred that a hydrogen atom is bonded to the α-position of the structural unit (a2). That is because a dissolution contrast becomes good.

(III) Combinations of Structural Unit (a1), Structural Unit (a2), and Structural Unit (a4)

Here, the structural unit (a1) is a structural unit expressed by the general formula (1) and it is preferable that R in the general formula (1) is a hydrogen atom. At the same time, it is preferred that a hydrogen atom is bonded to the α-position of the structural unit (a2) and that a hydrogen atom is bonded to the α-position of the structural unit (a4).

That is because a dissolution contrast becomes good.

(IV) Combinations of Structural Unit (a1), Structural Unit (a2), Structural Unit (a3), and Structural Unit (a4)

Here, the structural unit (a1) is a structural unit expressed by the general formula (1) and it is preferable that R in the general formula (1) is a hydrogen atom. At the same time, it is preferred that a hydrogen atom is bonded to the α-position of the structural unit (a2) and a hydrogen atom is bonded to the α-position of the structural unit (a4). This is because a dissolution contrast becomes good.

Proportion of Structural Units (a1) to (a4)

When combining the structural unit (a1) to the structural unit (a4) in the component (A1), one of four pairs of combinations which consist of (I), (II), (III), and (IV) is preferably selected. Therefore, a preferred proportion of each structural unit is represented below.

(I) Combinations of Structural Unit (a1) and Structural Unit (a2)

When the component (A1) includes at least the structural unit (a1) and the structural unit (a2) as two essential constituents and it is preferably a resin constituted by such two structural units, it is preferable that proportions of each structural units based on total of the structural units constituting the component (A1) satisfy the following range.

The proportion of the structural unit (a1) is preferably 20 to 80 mol %, more preferably 30 to 70 mol %, and most preferably 35 to 55 mol %.

The proportion of the structural unit (a2) is preferably 20 to 80 mol %, more preferably 30 to 70 mol %, and most preferably 35 to 55 mol %.

By satisfying such a range, the advantages of the invention improve. In addition, an effect for controlling the swelling improves.

(II) Combinations of Structural Unit (a1), Structural Unit (a2), and Structural Unit (a3)

When the component (A1) is a resin having the structural unit (a1), the structural unit (a2), and the structural unit (a3) and it is preferably a resin constituted by such structural units, it is preferable that proportions of each structural units based on total of the structural units constituting the component (A1) satisfy the following range.

The proportion of the structural unit (a1) is preferably 20 to 80 mol %, more preferably 30 to 70 mol %, and most preferably 35 to 55 mol %.

The proportion of the structural unit (a2) is preferably 10 to 70 mol %, more preferably 10 to 50 mol %, and most preferably 20 to 40 mol %.

The proportion of the structural unit (a3) is preferably 10 to 70 mol %, more preferably 10 to 40 mol %, and most preferably 15 to 35 mol %.

By satisfying such a range, the advantage of the invention improves. In addition, an effect for controlling the swelling improves. Furthermore, particularly, by adding the structural unit (a2) and the structural unit (a3) in balance, appropriate contrast can be obtained and thus resolution improves. In addition, etching resistance improves. Furthermore, a desired exposure safety margin can be obtained.

(III) Combinations of Structural Unit (a1), Structural Unit (a2), and Structural Unit (a4)

When the component (A1) is a resin having the structural unit (a1), the structural unit (a2), and the structural unit (a4) and it is preferably a resin constituted by such structural units, it is preferable that proportions of each structural units based on total of the structural units constituting the component (A1) satisfy the following range.

The proportion of the structural unit (a1) is preferably 20 to 85 mol %, more preferably 30 to 70 mol %, and most preferably 35 to 50 mol %.

The proportion of the structural unit (a2) is preferably 14 to 70 mol %, more preferably 15 to 50 mol %, and most preferably 30 to 50 mol %.

The proportion of the structural unit (a4) is preferably 1 to 70 mol %, more preferably 3 to 50 mol %, and most preferably 5 to 20 mol %.

By satisfying such a range, the advantages of the invention improve. In addition, an effect for controlling the swelling improves. Furthermore, a resist pattern becomes desirable.

By adding the structural unit (a1), the structural unit (a2), and the structural unit (a4) in balance, appropriate contrast can be obtained and thus resolution improves. In addition, etching resistance improves. Furthermore, a desired exposure safety margin can be obtained.

(IV) Combinations of Structural Unit (a1), Structural Unit (a2), Structural Unit (a3), and Structural Unit (a4)

When the component (A1) is a resin having the structural units (a1) to (a4) and it is preferably a resin constituted by such structural units, it is preferable that proportions of each structural units based on the resin satisfy the following range.

The proportion of the structural unit (a1) is preferably 10 to 85 mol %, more preferably 20 to 70 mol %, and most preferably 25 to 50 mol %.

The proportion of the structural unit (a2) is preferably 10 to 80 mol %, more preferably 20 to 70 mol %, and most preferably 30 to 50 mol %.

The proportion of the structural unit (a3) is preferably 4 to 70 mol %, more preferably 7 to 50 mol %, and most preferably 10 to 30 mol %.

The proportion of the structural unit (a4) is preferably 1 to 70 mol %, more preferably 3 to 50 mol %, and most preferably 5 to 20 mol %.

By satisfying such a range, the advantages of the invention improve. In addition, an effect for controlling the swelling further improves. Furthermore, a resist pattern becomes desirable.

By adding the structural units (a1) to (a4) in balance, appropriate contrast can be obtained and thus resolution improves. In addition, etching resistance improves. Furthermore, a desired exposure safety margin can be obtained.

In addition, the component (A1) may include other copolymerizable structural units other than a group selected from the structural units (a1) to (a4) but it is preferably a resin having a structural unit selected from a group of the structural units (a1) to (a4) as a main component.

Here, the main component means that a sum of structural units selected therefrom is 70 mol % or more, preferably 80 mol % or more. Among these, preferred is 100 mol %.

In addition, in the component (A1), a resin which consists of a group selected from the structural unit (a1) and the structural unit (a2); the structural unit (a1), the structural unit (a2), and the structural unit (a3); the structural unit (a1), the structural unit (a2), and the structural unit (a4); or the structural unit (a1) to the structural unit (a4) is particularly preferred, and a resin which consists of the structural unit (a1), the structural unit (a2), and the structural unit (a3) is more preferred.

Weight Average Molecular Weight

The weight average molecular weight (Mw; weight average molecular weight relative to polystyrene standards as measured by gel permeation chromatography) of the component (A1) is preferably within the range of 2,000 to 30,000, more preferably 2,000 to 10,000, and most preferably 3,000 to 8,000. The advantages of the invention improve by giving such a range. Moreover, it is preferable from the viewpoint of control of swelling, and control of the microbridge. Moreover, it is preferable in view of high level of resolution. It tends to acquire desirable properties by having a lower molecular weight.

The component (A1) can be obtained by a conventional radical polymerization of the monomers which derive each structural units.

The component (A1) may be used in combinations with an alkali soluble resin component different from the component (A1). For example, a hydroxystyrene resin, a novolak resin, an acryl resin and the like may be added thereto. However, the proportion of the component (A1) in the component (A) is preferably 70% by weight, more preferably 80% by weight, and particularly preferably 100% by weight.

<Acid Generator Component (B)>

An acid generator component (B) contains an acid generator (B1) expressed by the following general formula (B1) [hereinafter, referred to as a component (B1)]. By adding the component (B1), the advantages of the invention can be advanced.

In the general formula (B1), $R^{51}$ represents a straight chain, branched chain, or cyclic alkyl group, or a straight chain, branched chain, or cyclic fluorinated alkyl group.

As the straight chain or branched chain alkyl group, preferred is an alkyl group having 1 to 10 carbon atoms, more preferred is an alkyl group having 1 to 8 carbon atoms, and most preferred is an alkyl group having 1 to 4 carbon atoms.

As the cyclic alkyl group, an alkyl group having 4 to 12 carbon atoms is preferable, an alkyl group having 5 to 10 carbon atoms is more preferable, and an alkyl group having 6 to 10 carbon atoms is most preferable.

As the fluorinated alkyl group, an alkyl group having 1 to 10 carbon atoms is preferable, an alkyl group having 1 to 8 carbon atoms is more preferable, and an alkyl group having 1 to 4 carbon atoms is most preferable. The fluorination ratio of the fluorinated alkyl group (the proportion of fluorine atoms which are substituted for some or all of the hydrogen atoms of the alkyl group) is preferably 10 to 100%, and more preferably 50 to 100%. An alkyl group in which all of the hydrogen atoms are substituted with fluorine atoms is particularly preferred because an acid strength becomes strong.

As $R^{51}$, it is most desirable that it is a straight chain alkyl group or a fluorinated alkyl group.

$R^{52}$ represents a hydrogen atom, a hydroxyl group, a halogen atom, a straight chain, branched chain or cyclic alkyl group, a straight chain or branched chain halogenated alkyl group, or a straight chain or branched chain alkoxy group.

In $R^{52}$, examples of the halogen atom include a fluorine atom, a bromine atom, a chlorine atom, and an iodine atom, where a fluorine atom is preferred.

In $R^{52}$, the alkyl group has preferably straight chain or branched chain and carbon atoms thereof are preferably 1 to 5, particularly 1 to 4, further preferably 1 to 3.

In $R^{52}$, the halogenated alkyl group is a group in which all of or a part of the hydrogen atoms in the alkyl group is substituted with halogen atoms. In this case, the alkyl group means the "alkyl group" in $R^{52}$. The halogen atoms thus substituted are as described above. In the halogenated alkyl group, it is preferable that 50 to 100% of hydrogen atoms are substituted with halogen atoms and it is more preferable that all of the hydrogen atoms are substituted with halogen atoms.

In $R^{52}$, it is preferable that the alkoxy group has a straight chain or branched chain and carbon atoms thereof are preferably 1 to 5, particularly preferably 1 to 4, further preferably 1 to 3.

Among these, as $R^{52}$, a hydrogen atom is preferred.

$R^{53}$ represents an aryl group which may have a substituent and examples of a basic ring structure (maternal ring structure) of the aryl group in which a substituent has been removed include a naphthyl group, a phenyl group and an anthracenyl group. The phenyl group is preferable from the viewpoint of the advantage of the invention and absorption of the exposure light such as ArF excimer laser.

Examples of a substituent include a hydroxyl group, a lower alkyl group (which has a straight chain or branched chain and carbon atoms of 5 or less and is preferably a methyl group) or the like.

It is more preferable that the aryl group in $R^{53}$ does not have a substituent.

n represents an integer of 1-3, preferably 2 or 3, particularly preferably 3.

Preferred examples of the acid generator are as follows.

Compound (B1-i)

[Chemical Formula 8]

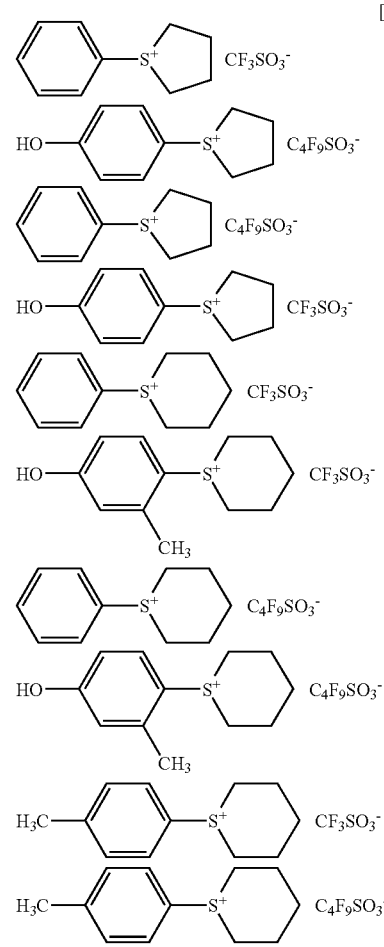

Among these, a compound expressed by the following general formula (b-0-1) [hereinafter, referred to as an acid generator (b1)] is preferred.

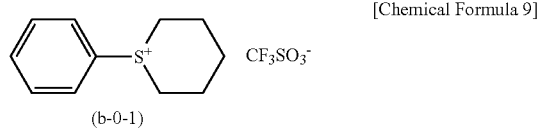

[Chemical Formula 9]

(b-0-1)

The component (B1) may be used alone or in combinations of two or more.

Moreover, it is preferable that another acid generator (B2) [hereinafter, referred to as a component (B2)] different from the component (B1) is used in addition to the component (B1). Accordingly, an effect for readily controlling a variety of characteristics such as sensitivity can be obtained.

The component (B2) is not particularly limited on its type, and examples of the component (B) include those that have been suggested as an acid generator for a chemically amplified resist. As the acid generator, there have been conventionally known an onium salt-based acid generator such as an iodonium salt and a sulfonium salt; an oxime sulfonate-based acid generator; a diazomethane-based acid generator such as bisalkyl or bisaryl sulfonyl diazomethanes, and poly(bissulfonyl) diazomethanes; a nitrobenzyl sulfonate-based acid generator; an iminosulfonate-based acid generator; a disulfone-based acid generator; and the like.

Examples of the onium salt-based acid generator include the compounds represented by the following general formula (b-1) or (b-2).

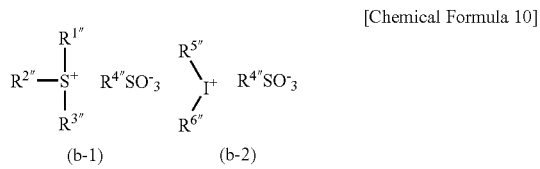

[Chemical Formula 10]

(b-1)   (b-2)

(where $R^{1''}$ to $R^{3''}$, and $R^{5''}$ to $R^{6''}$ each independently represent an aryl group or an alkyl group; $R^{4''}$ represents a straight-chained, branch-chained, or cyclic alkyl group or a fluorinated alkyl group; at least one of $R^{1''}$ to $R^{3''}$ represents an aryl group, and at least one of $R^{5''}$ to $R^{6''}$ represents an aryl group)

In the formula (b-1), $R^{1''}$ to $R^{3''}$ each independently represent an aryl group or an alkyl group. At least one of $R^{1''}$ to $R^{3''}$ represents an aryl group. Preferably, at least two of $R^{1''}$ to $R^{3''}$ represent an aryl group, and most preferably all of $R^{1''}$ to $R^{3''}$ represent an aryl group.

The aryl group of $R^{1''}$ to $R^{3''}$ is not particularly limited, and examples thereof include an aryl group having 6 to 20 carbon atoms, and part or all of the hydrogen atoms of the aryl group may be unsubstituted or substituted with an alkyl group, an alkoxy group, a halogen atom, or the like. The aryl group is preferably an aryl group having 6 to 10 carbon atoms in terms of low cost for synthesis. Specific examples of the aryl group include a phenyl group and a naphthyl group.

The alkyl group with which the hydrogen atom of the aryl group may be substituted is preferably an alkyl group having 1 to 5 carbon atoms, and most preferably a methyl group, an ethyl group, a propyl group, an n-butyl group, or a tert-butyl group.

The alkoxy group with which the hydrogen atom of the aryl group may be substituted is preferably an alkoxy group having 1 to 5 carbon atoms, and most preferably a methoxyl group, or an ethoxy group.

The halogen atom with which the hydrogen atom of the aryl group may be substituted is preferably a fluorine atom.

The alkyl group of $R^{1''}$ to $R^{3''}$ is not particularly limited, and examples thereof include a straight-chained, branch-chained, or cyclic alkyl group having 1 to 10 carbon atoms. Specific examples of the alkyl group include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. The number of carbon atoms is preferably in the range of 1 to 5 in view of resolution. A methyl group is preferred in terms of high resolution and low cost for synthesis.

Among these, most preferably $R^{1''}$ to $R^{3''}$ are all phenyl groups.

$R^{4''}$ represents a straight-chained, branch-chained, or cyclic alkyl group, or a fluorinated alkyl group.

The straight-chained or branch-chained alkyl group preferably has 1 to 10 carbon atoms, more preferably 1 to 8 carbon atoms, and most preferably 1 to 4 carbon atoms.

The cyclic alkyl group is a cyclic group as represented by $R^{1''}$ as above, and it preferably has 4 to 15 carbon atoms, and more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. The fluorination rate of the fluorinated alkyl group (the proportion of the fluorine atoms in the alkyl group) is preferably 10 to 100%, more preferably 50 to 100%, and particularly those in which all of the hydrogen atoms have been substituted with fluorine atoms, thus giving strong acidity, are preferred.

$R^{4''}$ is most preferably a straight-chained or cyclic alkyl group, or a fluorinated alkyl group.

In the formula (b-2), $R^{5''}$ and $R^{6''}$ each independently represents an aryl group or an alkyl group. At least one of $R^{5''}$ and $R^{6''}$ represent an aryl group. Preferably, all of $R^{5''}$ and $R^{6''}$ are each an aryl group.

Examples of the aryl group of $R^{5''}$ and $R^{6''}$ include those as described for the aryl group of $R^{1''}$ to $R^{3''}$.

Examples of the alkyl group of $R^{5''}$ and $R^{6''}$ include those as described for the alkyl group of $R^{1''}$ to $R^{3''}$.

Among these, $R^{5''}$ and $R^{6''}$ are most preferably all phenyl groups.

Examples of $R^{4''}$ in the formula (b-2) include those as described for $R^{4''}$ in the formula (b-1).

Specific examples of the onium salt-based acid generator include diphenyliodonium trifluoromethanesulfonate or nonafluorobutanesulfonate, bis(4-tert-butylphenyl) iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl) sulfonium trifluoromethanesulfonate, heptafluoropropanesulfonate or nonafluorobutanesulfonate, dimethyl(4-hydroxynaphthyl) sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methyl phenyl) diphenylsulfonium trifluoromethanesulfonate, heptafluoropropanesulfonate or nonafluorobutanesulfonate, (4-methoxyphenyl)

diphenylsulfonium trifluoromethanesulfonate, heptafluoropropanesulfonate or nonafluorobutanesulfonate, tri(4-tert-butyl)phenyl sulfonium trifluoromethanesulfonate, heptafluoropropanesulfonate or nonafluorobutanesulfonate, diphenyl(1-(4-methoxy) naphthyl) sulfonium trifluoromethanesulfonate, heptafluoropropanesulfonate or nonafluorobutanesulfonate, and the like. Also, onium salts in which the anionic part of those onium salts are substituted with methanesulfonate, n-propanesulfonate, n-butanesulfonate, or n-octanesulfonate can be used.

In the general formula (b-1) or (b-2), those in the anionic part is substituted with the anionic part represented by the following general formula (b-3) or (b-4) can also be used (the cationic part is the same as for (b-1) or (b-2)).

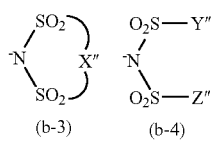

[Chemical Formula 11]

(where X" represents an alkylene group having 2 to 6 carbon atoms in which at least one hydrogen atom has been substituted with a fluorine atom; Y" and Z" each independently represent an alkyl group having 1 to 10 carbon atoms in which at least one hydrogen atom has been substituted with a fluorine atom)

X" is a straight-chain or branch-chained alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" are each independently a straight-chain or branch-chained alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

Smaller carbon atoms of the alkylene group of X", or of the alkyl group of Y" and Z" are better in terms of solubility in a resist solvent.

Furthermore, larger numbers of the hydrogen atoms substituted with a fluorine atom in the alkylene group of X", or in the alkyl group of Y" and Z" are better in terms of stronger acidity, and higher transparency to a high-energy light at 200 nm or less, or an electron beam. The proportion of the fluorine atoms in the alkylene group or alkyl group, that is, the fluorination rate is preferably 70 to 100%, still more preferably 90 to 100%, and a perfluoroalkylene group or perfluoroalkyl group in which all of the hydrogen atoms are substituted with fluorine atoms, thus giving strong acidity, is particularly preferred.

The oxime sulfonate-based acid generator is a compound having at least one group represented by the following general formula (B-1), which is characterized by generation of an acid upon irradiation with radiation. The oxime sulfonate-based acid generator is widely used for a chemically amplified resist composition, and thus can be optionally selected and used.

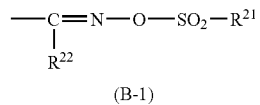

[Chemical Formula 12]

(B-1)

(where $R^{21}$ and $R^{22}$ each independently represent an organic group.)

The organic group is a carbon atom-containing group, and may contain atoms other than the carbon atom (for example, a hydrogen atom, an oxygen atom, a nitrogen atom, a sulfur atom, and a halogen atom (such as a fluorine atom, and a chlorine atom)).

The organic group of $R^{21}$ is preferably a straight-chained, branch-chained, or cyclic alkyl group or an aryl group. The alkyl group or the aryl group may have a substituent. The substituent is not particularly limited, and examples thereof include a fluorine atom, a straight-chained, branch-chained, or cyclic alkyl group having 1 to 6 carbon atoms, and a straight-chained, branch-chained, or cyclic alkoxy group having 1 to 6 carbon atoms. As used herein, the phrase "having a substituent" means that part or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. The alkyl group is particularly preferably a partially or completely halogenated alkyl group (sometimes referred to as the halogenated alkyl group, hereinafter). Furthermore, the partially halogenated alkyl group refers to an alkyl group in which part of the hydrogen atoms are substituted with halogen atoms, and the completely halogenated alkyl group refers to an alkyl group in which all of the hydrogen atoms are substituted with halogen atoms. Examples of the halogen atom include a fluorine atom, a chlorine atom, a bromine atom, and an iodine atom. It is particularly preferably a fluorine atom. That is, the halogenated alkyl group is preferably a fluorinated alkyl group.

The aryl group preferably has 4 to 20 carbon atoms, more preferably 4 to 10 carbon atoms, and most preferably 6 to 10 carbon atoms. The aryl group is particularly preferably a partially or completely halogenated aryl group. Furthermore, the partially halogenated aryl group refers to an aryl group in which part of the hydrogen atoms are substituted with halogen atoms, and the completely halogenated aryl group refers to an aryl group in which all of the hydrogen atoms are substituted with halogen atoms.

$R^{21}$ is particularly preferably an unsubstituted alkyl group having 1 to 4 carbon atoms, or a fluorinated alkyl group having 1 to 4 carbon atoms.

The organic group of $R^{22}$ is preferably a straight-chained, branch-chained, or cyclic alkyl group, an aryl group, or a cyano group. Examples of the alkyl group and the aryl group of $R^{22}$ include those as described for the alkyl group and the aryl group of $R^{21}$.

$R^{22}$ is particularly preferably a cyano group, an unsubstituted alkyl group having 1 to 8 carbon atoms, or a fluorinated alkyl group having 1 to 8 carbon atoms.

More preferable examples of the oxime sulfonate-based acid generator include the compounds represented by the following general formula (B-2) or (B-3).

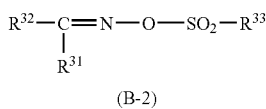

(B-2)

(where $R^{31}$ is a cyano group, an unsubstituted alkyl group, or a halogenated alkyl group; $R^{32}$ is an aryl group; and $R^{33}$ is an unsubstituted alkyl group or a halogenated alkyl group)

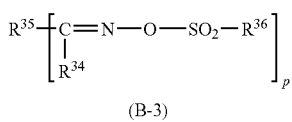

(B-3)

(where $R^{34}$ is a cyano group, an unsubstituted alkyl group, or a halogenated alkyl group; $R^{35}$ is an aromatic di-valent or tri-valent hydrocarbon group; $R^{36}$ is an unsubstituted alkyl group, or a halogenated alkyl group; and p is 2 or 3)

In the general formula (B-2), the unsubstituted alkyl group or the halogenated alkyl group of $R^{31}$ preferably has 1 to 10 carbon atoms, more preferably 1 to 8 carbon atoms, and most preferably 1 to 6 carbon atoms.

$R^{31}$ is preferably a halogenated alkyl group, and more preferably a fluorinated alkyl group.

The fluorinated alkyl group of $R^{31}$ is preferably one in which 50% or more of the total number in hydrogen atoms of the alkyl group are fluorinated, more preferably one in which 70% or more of the hydrogen atoms of the alkyl group are fluorinated, and most preferably one in which 90% or more of the hydrogen atoms of the alkyl group are fluorinated.

Examples of the aryl group of $R^{32}$ include a group in which one hydrogen atom has been removed from the ring of an aromatic hydrocarbon such as a phenyl group, a biphenyl group, a fluorenyl group, a naphthyl group, an anthracyl group, and a phenanthryl group; and a heteroaryl group in which a portion of the carbon atoms constituting those rings are substituted with a heteroatom such as an oxygen atom, a sulfur atom, and a nitrogen atom. Among these, a fluorenyl group is preferred.

The aryl group of $R^{32}$ may have a substituent such as an alkyl group, a halogenated alkyl group, an alkoxy group each having 1 to 10 carbon atoms, and a phenyl group not having a substituent. The alkyl group or the halogenated alkyl group as the substituent preferably has 1 to 8 carbon atoms, and more preferably 1 to 4 carbon atoms. Furthermore, the halogenated alkyl group is preferably a fluorinated alkyl group.

The unsubstituted alkyl group or the halogenated alkyl group of $R^{33}$ preferably has 1 to 10 carbon atoms, more preferably 1 to 8 carbon atoms, and most preferably 1 to 6 carbon atoms.

$R^{33}$ is preferably a halogenated alkyl group, more preferably a fluorinated alkyl group, and most preferably a partially fluorinated alkyl group.

The fluorinated alkyl group of $R^{33}$ is preferably one in which 50% or more of the total number of hydrogen atoms in the alkyl group are fluorinated, more preferably one in which 70% or more of the hydrogen atoms of the alkyl group are fluorinated, and most preferably one in which 90% or more of the hydrogen atoms of the alkyl group are fluorinated in terms of higher acidity of an acid generated. Most preferably, it is one in which 100% of the hydrogen atoms of the alkyl group are completely fluorinated.

In the general formula (B-3), examples of the unsubstituted alkyl group or the halogenated alkyl group of $R^{34}$ include those as described above for the unsubstituted alkyl group or the halogenated alkyl group of $R^{31}$.

Examples of the aromatic di-valent or tri-valent hydrocarbon group of $R^{35}$ include a group in which one or two hydrogen atoms are removed from the aryl group of $R^{32}$.

Example of the unsubstituted alkyl group or the halogenated alkyl group of $R^{36}$ include those as described above for the unsubstituted alkyl group or the halogenated alkyl group of $R^{33}$.

P is preferably 2.

Specific examples of the oxime sulfonate-based acid generator include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thien-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienylcyanide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethyl sulfonyloxyimino)-1-cyclohexenylacetonitrile, α-(isopropyl sulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethyl sulfonyloxyimino)-p-methoxyphenylacetonitrile, α-(propyl sulfonyloxyimino)-p-methylphenylacetonitrile, and α-(methylsulfonyloxyimino)-p-bromophenylacetonitrile.

Furthermore, examples of the oxime sulfonate-based acid generator include the compounds represented by the following formulae.

Compound Group (B-i)
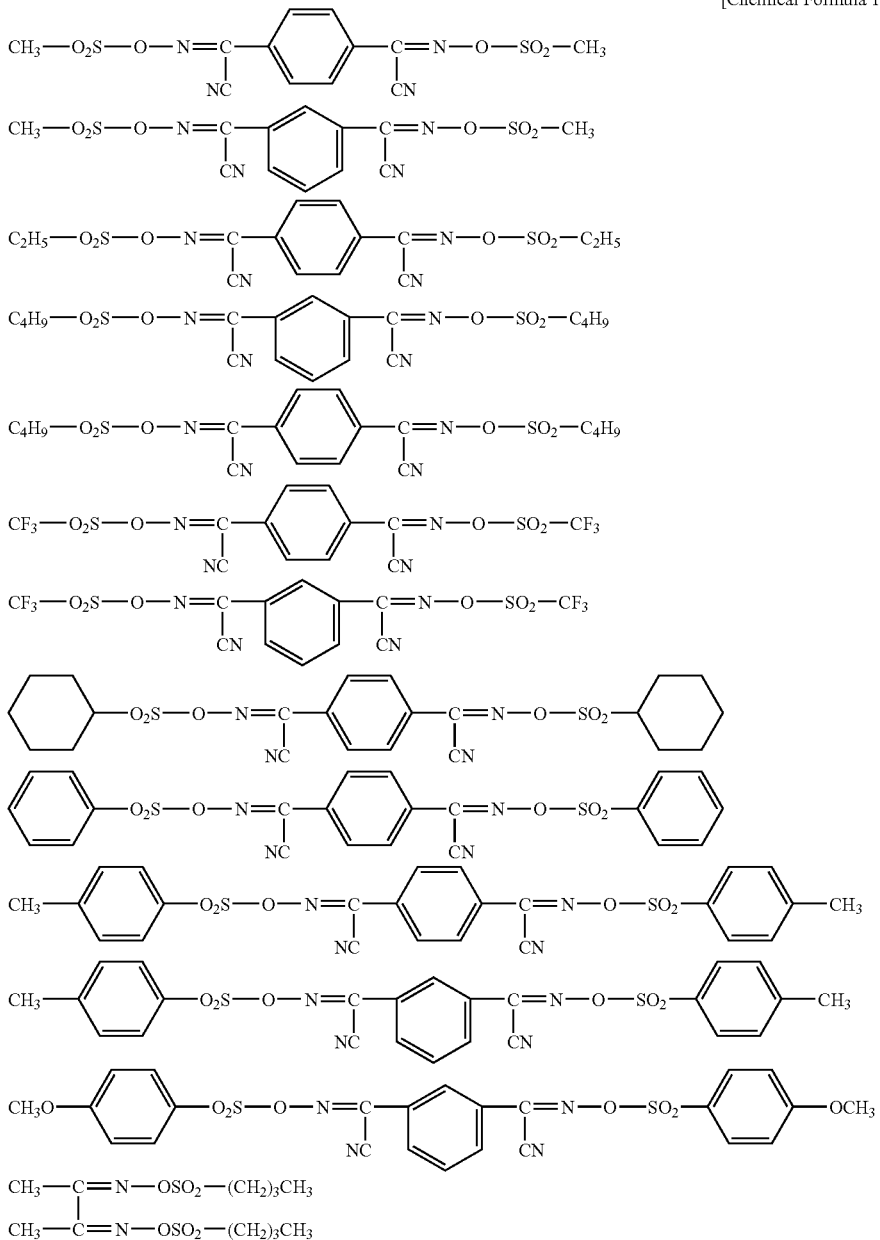
Examples of the preferable compounds, among the compounds represented by the above-described general formula (B-2) or (B-3), are as follows.
Compound Group (B-ii)
[Chemical Formula 16]

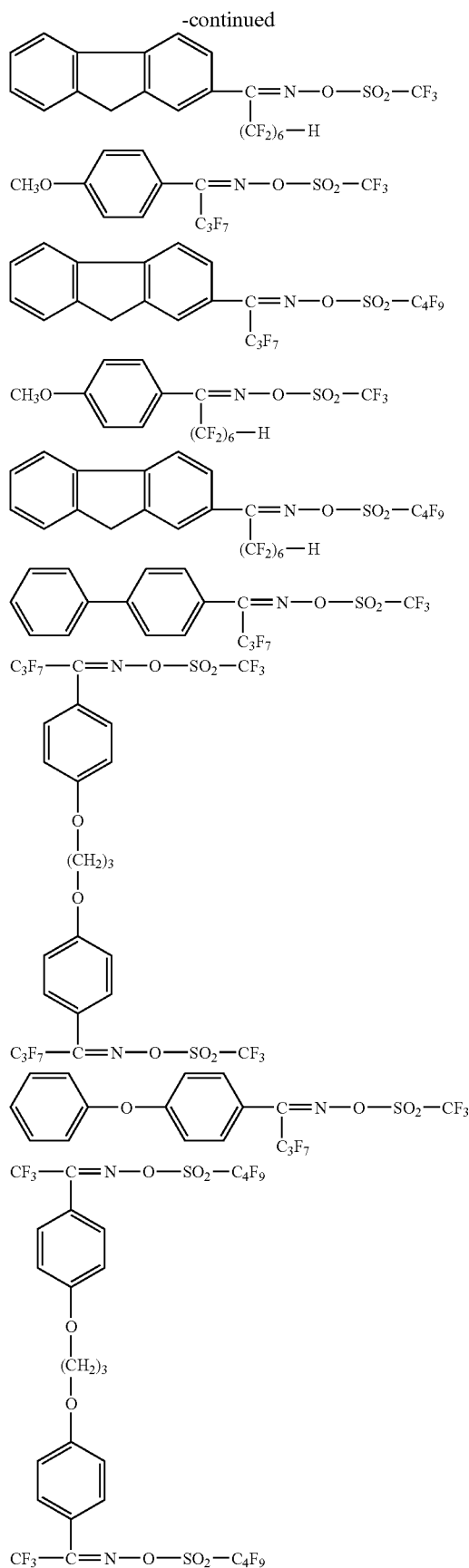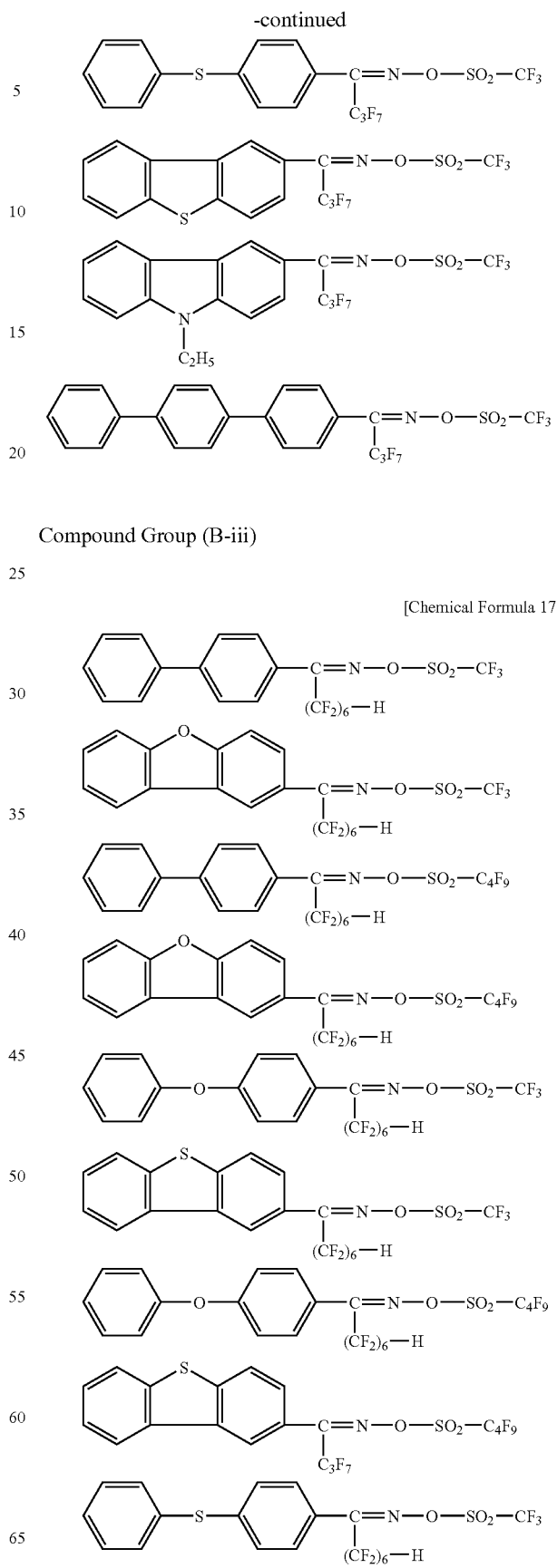
Compound Group (B-iii)
[Chemical Formula 17]

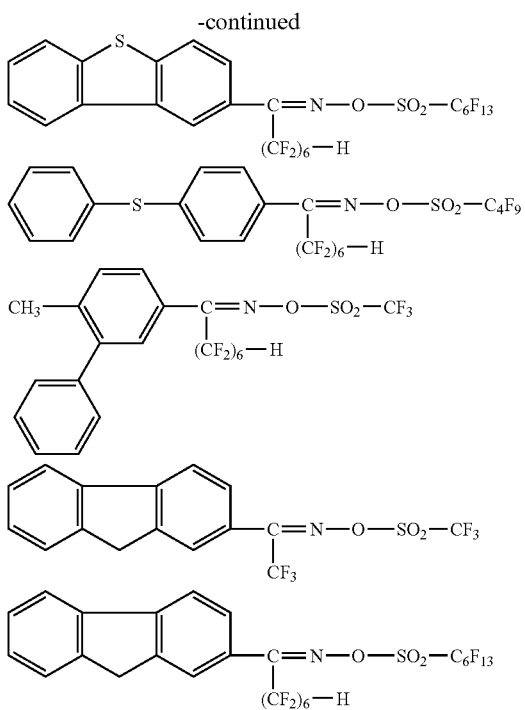

Among the exemplified compounds, the following three compounds are preferred.

Compound Group (B-I)

[Chemical Formula 18]

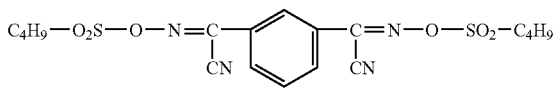

Compound Group (B-II)

[Chemical Formula 19]

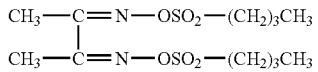

Compound Group (B-III)

[Chemical Formula 20]

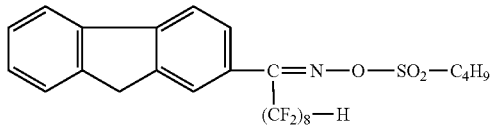

Among the diazomethane-based acid generators, specific examples of bisalkyl or bisarylsulfonyl diazomethanes include bis(isopropylsulfonyl) diazomethane, bis(p-toluenesulfonyl) diazomethane, bis(1,1-dimethylethylsulfonyl) diazomethane, bis(cyclohexyl sulfonyl) diazomethane, and bis(2,4-dimethylphenyl sulfonyl) diazomethane.

Furthermore, examples of the poly(bissulfonyl) diazomethanes include 1,3-bis(phenylsulfonyldiazomethylsulfonyl) propane (in the case of A=3), 1,4-bis(phenylsulfonyldiazomethylsulfonyl) butane (in the case of A=4), 1,6-bis (phenylsulfonyldiazomethylsulfonyl) hexane (in the case of A=6), 1,10-bis(phenylsulfonyldiazomethylsulfonyl) decane (in the case of A=10), 1,2-bis(cyclohexylsulfonyldiazomethylsulfonyl)ethane (in the case of B=2), 1,3-bis(cyclohexylsulfonyldiazomethylsulfonyl) propane (in the case of B=3), 1,6-bis(cyclohexylsulfonyldiazomethylsulfonyl) hexane (in the case of B=6), and 1,10-bis(cyclohexylsulfonyldiazomethylsulfonyl) decane (in the case of B=10), which have the following structures.

Compound (B-IV)

[Chemical Formula 21]

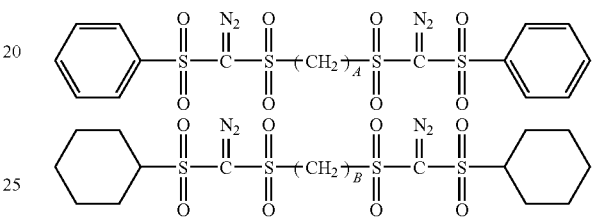

In the present invention, an onium salt which employs a fluorinated alkyl sulfonate ion as an anion is preferably used as the component (B2).

Among these, a sulfonium salt is preferred.

In addition, it is preferable that the cation moiety of the component (B2) include at least one group, more preferably three groups, selected from a phenyl group or a naphthyl group which may have a substituent such as a straight chain or branched chain lower alkyl group having 1 to 5 carbon atoms or a straight chain or branched chain lower alkoxy group having 1 to 5 carbon atoms.

Among these, triphenylsulfonium trifluorometanesulfonate [hereinafter, referred to as an acid generator (b2)] is preferred.

The component (B2) may be used alone or in combinations of two or more.

The amount of the component (B) is 0.5 to 30 parts by weight and preferably 1 to 10 parts by weight, based on 100 parts by weight of the component (A). By giving the amount in such a range, a pattern formation can be sufficiently performed. In addition, a homogeneous solution can be obtained so that storage stability becomes desirable.

In addition, the amount of the component (B1) in the component (B) is preferably 50% by weight or more, particularly preferably 70 to 100% by weight, further preferably 90 to 100% by weight.

Crosslinking Agent Component (C)

A component (C) is not particularly limited, and a suitable one for use may be selected from known crosslinking agents used in conventional chemically amplified negative resist compositions.

Specific examples of such crosslinking agents include alicyclic hydrocarbons containing a hydroxyl group and/or a hydroxyalkyl group, such as 2,3-dihydroxy-5-hydroxymethyl norbornane, 2-hydroxy-5,6-bis(hydroxymethyl) norbornane, cyclohexane dimethanol, 3,4,8 (or 9)-trihydroxy tricyclodecane, 2-methyl-2-adamantanol, 1,4-dioxane-2,3-diol and 1,3,5-trihydroxycyclohexane; or oxygen-containing derivatives thereof In addition, compounds may be used which are prepared by reacting formaldehyde, or formaldehyde and a lower alcohol, with an amino group-containing compound such as melamine, acetoguanamine, benzoguanamine, urea, ethylene urea, propylene urea, and glycoluril and then substituting the hydrogen atom of the amino group with a hydroxymethyl group or lower alkoxymethyl group.

Among these, a crosslinking agent using melamine refers to a melamine-based crosslinking agent; the one using urea refers to a urea-based crosslinking agent; the one using alkylene urea, such as ethylene urea or propylene urea, refers to alkylene urea-based crosslinking agent; and the one using glycoluril refers to a glycoluril-based crosslinking agent. As the component (C), it is preferable that at least one is selected from a group which consists of a melamine-based crosslinking agent, a urea-based crosslinking agent, an alkylene urea-based crosslinking agent, and a glycoluril-based crosslinking agent. Particularly, the glycoluril-based crosslinking agent is preferable.

As the melamine-based crosslinking agent, compounds may be used which are prepared by reacting melamine and formaldehyde and then substituting the hydrogen atom of the amino group with a hydroxymethyl group, or compounds prepared by reacting melamine, formaldehyde, and a lower alcohol, and then substituting 1 to 6 hydrogen atoms of the amino group with a lower alkoxyalkyl group (having 2 to 8 carbon atoms). Specific examples thereof include hexamethoxymethylmelamine, hexaethoxymethylmelamine, hexapropoxymethylmelamine, hexabutoxybuthylmelamine and the like. Among these, hexamethoxymethylmelamine is preferred.

As the urea-based crosslinking agent, compounds may be used which are prepared by reacting urea and formaldehyde and then substituting the hydrogen atom of the amino group with a hydroxymethyl group, or compounds prepared by reacting urea, formaldehyde, and a lower alcohol and then substituting the hydrogen atom of the amino group with a lower alkoxyalkyl group (having 2 to 8 carbon atoms). Specific examples thereof include bismethoxymethyl urea, bisethoxymethyl urea, bispropoxymethyl urea, bisbutoxymethyl urea, and the like. Among these, bismethoxymethyl urea is preferred.

As the alkylene urea-based crosslinking agent, a compound expressed by the following general formula (III) may be used.

[Chemical Formula 22]

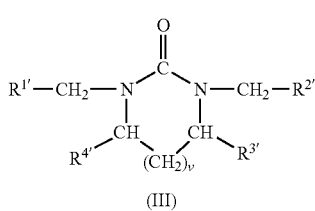

(III)

(where $R^{1'}$ and $R^{2'}$ independently represent a hydroxyl group or lower alkoxy group; $R^{3'}$ and $R^{4'}$ independently represent a hydrogen atom, hydroxyl group, or lower alkoxy group; and v is 0 or an integer of 1 to 2.)

When $R^{1'}$ and $R^{2'}$ represent a lower alkoxy group, an alkoxy group may be used having 1 to 4 carbon atoms and including a straight chain or branched chain. $R^{1'}$ and $R^{2'}$ may be the same or different from each other, but being the same is preferred.

When $R^{3'}$ and $R^{4'}$ represent a lower alkoxy group, an alkoxy group may be used having 1 to 4 carbon atoms and include a straight chain or branched chain. $R^{3'}$ and $R^{4'}$ may be the same or different from each other, but being the same is preferred.

v is 0 or an integer of 1 to 2 but preferably 0 or 1.

As the alkylene urea-based crosslinking agent, preferred is a compound in which v is 0 (ethylene urea-based crosslinking agent) and/or a compound in which v is 1 (propylene urea-based crosslinking agent).

The compound expressed by the general formula (III) can be prepared by the condensation reaction of alkylene urea with formaldehyde and by the reaction of the condensed product with a lower alcohol.

Specific examples of the alkylene urea compounds include an ethylene urea-based crosslinking agent, such as mono- and/or dihydroxymethyl ethyleneurea, mono- and/or dimethoxymethyl ethyleneurea, mono- and/or diethoxymethyl ethyleneurea, mono- and/or dipropoxymethyl ethyleneurea, and mono- and/or dibutoxymethyl ethyleneurea; a propylene urea-based crosslinking agent, such as mono- and/or dihydroxymethyl propyleneurea, mono- and/or dimethoxymethyl propyleneurea, mono- and/or diethoxymethyl propyleneurea, mono- and/or dipropoxymethyl propyleneurea, and mono- and/or dibutoxymethyl propyleneurea, 1,3-di(methoxymethyl)-4,5-dihydroxy-2-imidazolidinone, 1,3-di(methoxymethyl)-4,5-dimethoxy-2-imidazolidinone and the like.

As a glycoluril-based crosslinking agent, a glycoluril derivative substituted by a hydroxyalkyl group and/or an alkoxyalkyl group at the N-position may be used. Such a glycoluril derivative can be obtained by a condensation reaction of glycoluril with formaldehyde and by the reaction of the condensed product with a lower alcohol having 1 to 5 carbon atoms.

Specific examples of the glycoluril-based crosslinking agent include mono-, di-, tri- and/or tetrahydroxymethyl glycoluril, mono-, di-, tri- and/or tetramethoxymethyl glycoluril, mono-, di-, tri- and/or tetraethoxymethyl glycoluril, mono-, di-, tri- and/or tetrapropoxymethyl glycoluril, mono-, di-, tri- and/or tetrabutoxymethyl glycoluril, and the like.

The component (C) may be used alone or in combinations of two or more.

The blending amount of the component (C) is preferably 3 to 30 parts by weight, more preferably 3 to 15 parts by weight, and most preferably 5 to 10 parts by weight, based on 100 parts by weight of the component (A). When the amount of the component (C) is above the lower limit of such a range, a crosslinking formation is sufficiently performed so that a desirable resist pattern can be obtained. When the amount of the component (C) is below the upper limit of such a range, storage stability of a resist coating solution becomes desirable and deterioration in sensitivity over time is inhibited.

In the negative resist composition of the invention, in order to improve the resist pattern shape and post exposure stability of the latent image formed by the pattern-wise exposure of the resist layer, a nitrogen-containing organic compound (D) (hereinafter, referred to as the component (D)) can be additionally used.

A multitude of the component (D) has already been proposed and any of these known compounds can be used, although an aliphatic amine, such as a secondary aliphatic amine or tertiary aliphatic amine, is preferred.

As the aliphatic amine, amine prepared by substituting at least one hydrogen atom of ammonia ($NH_3$) with an alkyl group or hydroxyalkyl group having 12 or less carbon atoms (alkyl amine or alkyl alcohol amine) may be used. Specific examples thereof include monoalkyl amines such as n-hexylamine, n-heptylamine, n-octylamine, n-nonylamine, and n-decylamine; dialkylamines such as diethylamine, di-n-propylamine, di-n-heptylamine, di-n-octylamine and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkylalcohol amines such as diethanolamine, triethanolamine, diisopropanolamine, tri-isopropanolamine, di-n-octanol amine, and tri-n-octanol amine. Among these, alkylalcohol amines and trialkylamines are preferable and alkylalcohol amine is the most preferable. Of alkylalcohol amines, triethanolamine and tri-isopropanolamine are the most preferable.

These compounds may be used alone, or in combinations of two or more.

This component (D) is used in a quantity in the range of generally 0.01 to 5.0 parts by weight, based on 100 parts by weight of the component (A).

Furthermore, in order to prevent any deterioration in sensitivity caused by the addition of the aforementioned component (D) and improve the resist pattern shape and the post exposure stability of the latent image formed by the patternwise exposure of the resist layer, an organic carboxylic acid or a phosphorus oxo acid or derivatives thereof (E) can also be added as another optional component. In addition, the component (D) and the component (E) can be used in combination, or either one can also be used alone.

Examples of organic caroxylic acids include malonic acid, citric acid, malic acid, succinic acid, benzoic acid, and salicylic acid.

Examples of phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate ester, di-n-butyl phosphonate ester, phenylphosphonic acid, diphenyl phosphonate ester, and dibenzyl phosphonate ester; and phosphinic acid or derivatives thereof such as esters, including phosphinic acid and phenylphosphinic acid, and of these, phosphonic acid is particularly preferred.

The component (E) is used in a quantity in the range of 0.01 to 5.0 parts by weight, based on 100 parts by weight of the component (A).

The negative resist composition of the invention can be produced by dissolving the materials in an organic solvent.

The organic solvent can be any solvent capable of dissolving each components to generate a homogenous solution, and the solvent used can be one, or two or more solvents selected from amongst known solvents used for conventional chemically amplified resists.

Examples of the solvent include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used alone, or as a mixed solvent of two or more solvents.

In particular, mixed solvents of propylene glycol monomethyl ether acetate (PGMEA) and a polar solvent are preferred. The blending ratio (weight ratio) thereof can be appropriately determined by considering compatibility between PGMEA and the polar solvent but the weight ratio of PGMEA: polar solvent is preferably in the range of 1:9 to 9:1, and more preferably 2:8 to 8:2.

In the case where EL serving as the polar solvent is mixed with PGMEA, the weight ratio of PGMEA:EL is preferably in the range of 1:9 to 9:1, and more preferably 2:8 to 8:2.

In addition, as other organic solvents, at least one selected from PGMEA and EL, and a mixed solvent with γ-butyrolactone is also preferable. In this case, the blending ratio is determined to give the weight ratio of the former and the later preferably in the range of 70:30 to 95:5.

In addition, propylene glycol monomethyl ether (PGME) is also preferred.

The amount of the organic solvents to be used is not particularly limited and appropriately set to give a suitable concentration for coating a substrate in accordance with the desired film thickness. In general, the organic solvents are used to give a solid fraction concentration for the resist composition in the range of 2 to 20% by weight, preferably 5 to 15% by weight.

Miscible additives can also be added to the negative resist composition of the invention according to need, and, for examples, additive resins may be appropriately added for improving the properties of the resist film, as well as surfactants for improving the ease of application, dissolution inhibitors, plasticizers, stabilizers, colorants, halation prevention agents and dyes.

<<Method of Forming Resist Pattern>>

According to a method of forming a resist pattern, a negative resist composition of the invention is coated on top of a substrate, a prebake (Post Applied Bake; PAB) is performed thereon, a selective exposure treatment of the film is performed and then subjected to PEB (post exposure baking), and an alkali developing treatment is performed, thereby forming a resist pattern.

The method of forming the resist pattern of the invention can be conducted, for example, in the manner described below.

Namely, the negative resist composition is first applied to the surface of a substrate such as a silicon wafer using a spinner or the like, a prebake is conducted under temperature conditions of 80° C. to 150° C. for 40 to 120 seconds, and preferably for 60 to 90 seconds, and then following selective exposure of an ArF excimer laser through a desired mask pattern using, for example, an ArF exposure apparatus, PEB is conducted under temperature conditions of 80° C. to 150° C. for 40 to 120 seconds, and preferably for 60 to 90 seconds. Subsequently, developing is conducted using an alkali developer such as a 0.1 to 10 mass % aqueous solution of tetramethylammonium hydroxide. In this manner, a resist pattern which is faithful to the mask pattern can be obtained.

An organic or inorganic anti-reflective film may also be provided between the substrate and the applied layer of the resist composition.

In addition, as the substrate, a silicon substrate may be used. For example, when the silicon substrate is used, an anti-reflective film is formed as described above, a resist film is formed thereon, and a treatment such as exposure is performed. In addition, when a conventional negative resist composition is used, the pattern shape tends to be formed in a T-top shape. However, by using the negative resist composition of the present invention, a desired rectangular pattern can be obtained.

Other than the silicon substrate generally used, there may be used specified substrates such as a silicon substrate equipped with a thin film such as SiON, SiN, $Si_3N_4$, polycrystalline silicon, and TiN. Also, there may be used a substrate having irregularities (concave) so called an irregular substrate.

In the specified substrate equipped with the thin film, particularly a substrate equipped with the thin film using components including nitrogen such as SiON and SiN (hereinafter, referred to as 'SiON substrate' and 'SiN substrate'), a pattern shape of the surface of the substrate tends to be deteriorated because of a deactivation in acids of the acid generator and generation of erosion between the substrate and the pattern. However, even when the negative resist composition of the invention is used in such a specified substrate, a desirable pattern shape can be obtained.

When the resist pattern is formed on the irregular substrate used in prior art, the thickness of the resist film became partially thick at a concave portion. In such a thick portion, the exposed light does not reach the surface of the substrate so the pattern shape tends to be deteriorated. However, even when such an irregular substrate is used, improvements in pattern shape can be obtained by using the negative resist composition of the present invention.

There are no particular restrictions on the wavelength used for the exposure, and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. The resist composition according to the invention is particularly effective for use with an ArF excimer laser.

In the present invention, a chemically amplified negative resist composition and a method of forming a resist pattern which provides a desirable pattern shape can be obtained.

In addition, even when the resist pattern is formed on an irregular substrate or an inorganic substrate such as a SiN or SiON substrate, a desirable pattern shape can be obtained.

Furthermore, resolution is also good. Other lithographic characteristics such as resolution and depth of focus (DOF) characteristic can be improved.

In addition, since the component (B1) has an excellent heat resistance, it is preferable.

The reasons why an excellent pattern shape can be obtained in the invention are not entirely clear. However, it is believed that those effects are obtained by using the component (A) such to prevent swelling of the pattern and by high transparency of the acid generator (B1) and high dissolution to the alkali developer.

That is, since the acid generator (B1) is formed in a structure having one aryl group, an absorption ratio of the exposure light such as ArF excimer laser light is small. Therefore, the light is transmitted to the surface of the substrate, thereby preventing a T-top shape. In addition, when the dissolution to the alkali developer is low, development contrast of an unexposed portion and an exposed portion becomes low so that a T-top shape tends to be formed. However, it is thought that such a phenomenon is prevented because the acid generator (B1) includes a high level of alkali dissolution.

In addition, it is thought that a pattern shape improves by the synergic effects caused by the combination with component (A1) as described above.

The reasons why an excellent pattern shape can be obtained when using the specified substrate are not entirely clear. However, in addition to the effects described above, it is thought that the high level of the transparency of the acid generator (B1) allows the exposure light to be transmitted to the surface of the substrate so that a sufficient amount of acid is generated in the surface of the substrate and thus generation of erosion caused by deactivation of acid can be inhibited.

In addition, the reasons why an excellent pattern shape can be obtained when using the irregular substrate are not entirely clear. However, in addition to the effects described above, it is thought that the high level of the transparency of the acid generator (B1) allows the exposure light to be transmitted to the surface of the substrate regardless of a thick film thickness of the resist film and thus the pattern shape in the portion having thick film thickness can be improved.

EXAMPLES

Monomers Used in Synthesis Examples

In the synthesis examples, the following monomers were used.

(i) NBHFAA (norbornane hexafluoroalcohol acrylate) expressed by the following general formula General Formula (M-i)

[Chemical Formula 23]

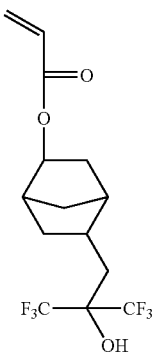

(ii) HEMA (hydroxyethyl methacrylate) expressed by the following general formula General Formula (M-ii)

[Chemical Formula 24]

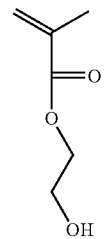

(iii) AdOHA (adamantanol acrylate) expressed by the following general formula

General Formula (M-iii)

[Chemcial Formula 25]

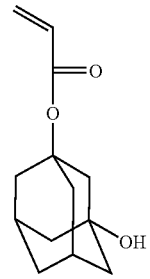

Synthesis Example 1

In the present synthesis examples, NMR was measured by using JNM-AL400 manufactured by Japan Electron Optics Laboratories (product name; resolution 400 MHz).

13.58 g of NBHFAA, 1.76 g of HEMA, 6.0 g of AdOHA, and 0.6 g of azobisisodimethyl acetate serving as a polymerization initiator were dissolved in 200 ml of THF (tetrahydrofuran). A nitrogen bubbling treatment was conducted for about 10 minutes and the resultant was stirred for 4 hours while elevating the temperature using an oil bath at 70° C. and then cooled to room temperature. Next, a reaction solution was concentrated using an evaporator and then the concentrated solution was dissolved in 120 ml of THF and added to 1,000 ml of heptanes, thereby extracting and filtering a resin. The resin thus obtained was dried using a drier at 40° C. for 24 hours, thereby obtaining 18.8 g of a white solid (yield 88.0%).

A chemical formula of the resin thus obtained is as follows. The weight average molecular weight thereof was 5,400 and the dispersion degree (Mw/Mn (Mn is a number average molecular weight)) was 1.73. As confirmed by a C13-NMR, a composition ratio (mol %) was 50/17/33 [in the following general formula, the numbers next to round brackets of each structural units is a mol ratio]. This is a resin 1.

Resin 1

[Chemical Formula 26]

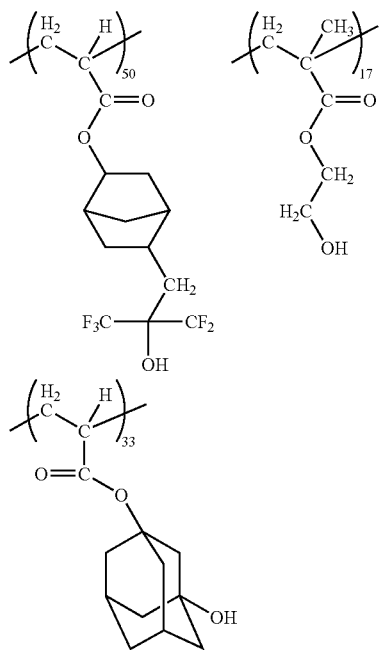

Example 1

A negative resist composition having a composition represented in Table 1 was prepared by using the resin 1 obtained in the synthesis examples and an acid generator (b1).

The resist composition thus obtained was evaluated as described below.

The negative resist composition was applied by a spinner onto an 8-inch substrate and prebaked (PAB) under conditions represented in Table 1 on a hot plate to form a resist layer of 300 nm in thickness.

Then, the resist layer was selectively irradiated with an ArF excimer laser (193 nm) by using an ArF light exposure system NSR-S302 (manufactured by Nikon Corporation; NA (Numerical Aperture)=0.60, 2/3 inline (Annular)) via a mask pattern (binary).

The resist layer was then subjected to PEB treatment under the conditions represented in Table 1 and then subjected to a developing treatment in a paddle method with 2.38 weight % of tetramethyl ammonium hydroxide for 60 seconds. Thereafter, the resist layer was washed by water for 20 seconds and then dried, thereby forming a resist pattern.

At this time, in a line and space pattern (referred to as L&S pattern) (pitch 357 nm) of 150 nm, an optimum exposure dose (sensitivity; Eop) formed by a ratio of a line width and a space width of 1:1 was obtained.

In addition, a resolution limit which enables a resolution at this Eop was obtained by changing the size of the L&S pattern.

In addition, a profile of the resulting L&S patterns was observed by a scanning an electron microscope and evaluated.

The results are shown in Table 2.

Examples 2 and 3 and Comparative Examples 1 and 2

A negative resist composition was prepared to have a composition represented in Table 1 and evaluated in the same manner as Example 1. The results are shown in Table 2.

[Table 1]

TABLE 1

| | Component (A) | Component (B) | Component (C) | | Component (D) | Organic Solvent | Substrate | PAB | PEB |
|---|---|---|---|---|---|---|---|---|---|
| Example 1 | RESIN 1 (100) | PAG1 (2.0) | Binder1 (5.0) | — | AMINE1 (0.4) | PGME (1150) | SiON Substrate | 80° C./60 seconds | 130° C./60 seconds |
| Example 2 | RESIN 1 (100) | PAG1 (2.0) | Binder1 (2.5) | Binder2 (2.5) | AMINE2 (0.2) | PGME (1150) | SiN Substrate | 80° C./60 seconds | 110° C./60 seconds |
| Example 3 | RESIN 1 (100) | PAG1 (2.0) | Binder1 (5.0) | | AMINE2 (0.2) | PGME (1150) | SiN Substrate | 80° C./60 seconds | 130° C./60 seconds |
| Comparative Example 1 | RESIN 1 (100) | PAG2 (2.0) | Binder1 (5.0) | | AMINE1 (0.4) | PGME (1150) | SiON Substrate | 80° C./60 seconds | 130° C./60 seconds |

TABLE 1-continued

| | Component (A) | Component (B) | Component (C) | Component (D) | Organic Solvent | Substrate | PAB | PEB |
|---|---|---|---|---|---|---|---|---|
| Comparative Example 2 | RESIN 1 (100) | PAG2 (2.0) | Binder1 (5.0) | AMINE2 (0.3) | PGME (1150) | SiN Substrate | 80° C./60 seconds | 130° C./60 seconds |

The values within round brackets below the blending components refer to a blending amount (parts by weight).

In Table 1, the meanings of the abbreviations are described below.

PAG 1: acid generator (b1) (acid generator expressed by a general formula (b-0-1))

PAG 2: acid generator (b2) (triphenylsulfonium trifluoromethanesulfonate)

AMINE 1: triisopropanolamine

AMINE 2: triethanolamine

Binder 1: tetramethoxymethyl glycoluril (product name: Mx-270, manufactured by Sanwa Chemical Co Ltd.)

Binder 2: tetrabuthoxymethyl glycoluril (product name: E-2403, manufactured by Sanwa Chemical Co Ltd.)

PGME: propylene glycol monomethyl ether

TABLE 2

| | Resolution (nm) | Shape | Sensitivity (mJ/cm$^2$) |
|---|---|---|---|
| Example 1 | 130 | Good | 22.0 |
| Example 2 | 140 | Excellent | 29.0 |
| Example 3 | 140 | Good | 22.0 |
| Comparative Example 1 | 140 | Poor | 21.5 |
| Comparative Example 2 | 140 | Poor | 21.5 |

The evaluation standards with respect to the shapes are as follows.

Excellent: A resist pattern which does not include erosion between the resist pattern and the substrate and is formed in an excellent rectangular shape.

Good: A resist pattern which does not include erosion between the resist pattern and the substrate and is formed in a good rectangular shape.

Poor: A resist pattern which includes erosion between the resist pattern and the substrate.

As it is apparent from the results of the Table 2, even in unfavorable conditions using a specified substrate, the negative resist composition of the invention can form a pattern in an excellent shape. In addition, the resolution was excellent.

In the embodiments according to the present invention, the depth of focus characteristic was excellent. An exposure safety margin was evaluated and all showed excellent results.

INDUSTRIAL APPLICABILITY

According to a negative resist composition and a method of forming a resist pattern of the present invention, a resist pattern having an excellent pattern shape can be formed.

The invention claimed is:

1. A negative resist composition, comprising:
   (A) an alkali soluble resin component;
   (B) an acid generator component which generates an acid upon exposure; and
   (C) a crosslinking agent component,
   wherein the component (A) contains an alkali soluble resin component (A1) having a structural unit (a1) containing an alicyclic group having a fluorinated hydroxyalkyl group, a structural unit (a2) derived from an acrylic acid ester and containing a hydroxyl group-containing alicyclic group and a structural unit (a3) which is derived from acrylic acid, does not have a ring structure, and has an alcoholic hydroxyl group at a side chain; and wherein the component (B) contains an acid generator (B1) expressed by a general formula (B1) below:

[Chemical Formula 1]

$$R^{53}-S^+\begin{bmatrix}R^{52}\\CH_2\end{bmatrix}_n R^{51}SO_3^-$$

(B1)

(wherein $R^{51}$ represents a straight chain, branched chain or cyclic alkyl group or a fluorinated alkyl group; $R^{52}$ represents a hydrogen atom, hydroxyl group, halogen atom, straight chain, branched chain or cyclic alkyl group, straight chain or branched chain halogenated alkyl group, or straight chain or branched chain alkoxy group; $R^{53}$ represents an aryl group which may have a substituent; and n represents an integer of 1 to 3).

2. The negative resist composition according to claim 1, wherein the component (B) contains an acid generator (B2) different from the acid generator (B1).

3. The negative resist composition according to claim 1, wherein the structural unit (a1) includes a structural unit represented the following general formula (1);

[Chemical Formula 2]

$$\begin{array}{c}
\{CH_2-CR\}\\
|\\
C=O\\
|\\
O\\
|\\
\langle\rangle\\
|\\
(CH_2)_t\\
|\\
F_{2r+1}C_r-C-C_sF_{2s+1}\\
|\\
OH
\end{array}$$

(1)

(wherein R is a hydrogen atom, alkyl group, fluorinated alkyl group, or fluorine atom, and r, s, and t are independently an integer of 1 to 5).

4. The negative resist composition according to claim 1, wherein the structural unit (a2) includes a structural unit including an alicyclic group having 5 to 15 carbon atoms.

5. The negative resist composition according to claim 1, wherein the structural unit (a2) includes a structural unit expressed by the following general formula (2);

[Chemical Formula 3]

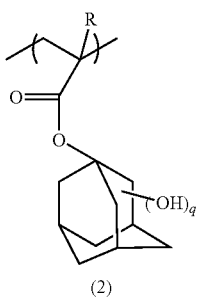

(2)

(wherein R represents a hydrogen atom, alkyl group, fluorinated alkyl group, or fluorine atom and q is an integer of 1 to 3).

6. The negative resist composition according to claim 1, wherein the structural unit (a3) includes a structural unit expressed by the following general formula (3);

[Chemical Formula 4]

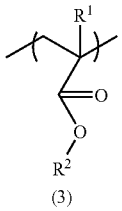

(3)

(wherein $R^1$ is a hydrogen atom, an alkyl group, a fluorinated alkyl group, a fluorine atom, or a hydroxyalkyl group, $R^2$ is a hydrogen atom, an alkyl group, or a hydroxyalkyl group, and at least one of $R^1$ and $R^2$ is a hydroxyalkyl group).

7. The negative resist composition according to claim 1, wherein the structural unit (a3) includes a structural unit derived from α-(hydroxyalkyl)acrylic acid alkyl ester.

8. The negative resist composition according to claim 1, wherein the structural unit (a3) includes a structural unit derived from acrylic acid (α-alkyl) hydroxyalkyl ester.

9. The negative resist composition according to claim 1, wherein the component (C) includes at least one selected from the group consisting of a melamine-based crosslinking agent, a urea-based crosslinking agent, an ethylene urea-based crosslinking agent, and a glycoluril-based crosslinking agent.

10. The negative resist composition according to claim 1, further comprising a nitrogen-containing organic compound (D).

11. A method of forming a resist pattern comprising: forming a resist film on a substrate by using a negative resist composition according to claim 1; selectively exposing the resist film; and forming a resist pattern by subjecting the resist film to an alkali developing treatment.

* * * * *